(12) United States Patent
Poulsen et al.

(10) Patent No.: US 8,976,981 B2
(45) Date of Patent: Mar. 10, 2015

(54) CIRCUIT, SYSTEM AND METHOD FOR ISOLATING A TRANSDUCER FROM AN AMPLIFIER IN AN ELECTRONIC DEVICE

(75) Inventors: Jens Kristian Poulsen, Kitchener (CA); Mohamad El-Hage, Cambridge (CA)

(73) Assignee: BlackBerry Limited, Waterloo, Ontario (CA)

( * ) Notice: Subject to any disclaimer, the term of this patent is extended or adjusted under 35 U.S.C. 154(b) by 938 days.

(21) Appl. No.: 12/900,061

(22) Filed: Oct. 7, 2010

(65) Prior Publication Data
US 2012/0087515 A1 Apr. 12, 2012

(51) Int. Cl.
*H03G 3/00* (2006.01)
*H03F 1/00* (2006.01)
*H03F 3/187* (2006.01)

(52) U.S. Cl.
CPC ............... *H03F 3/187* (2013.01); *H03G 3/001* (2013.01); *H03F 2200/03* (2013.01)
USPC .......................................... 381/104; 330/192

(58) Field of Classification Search
CPC ............... H03G 3/00; H03F 1/00; H03F 1/34; H03F 3/211; H03F 3/45179; H03F 3/45475; H03F 2203/45306; H03F 2203/45528; H03F 2203/45726; H03F 2203/5033; H03F 3/45085; H03F 3/45479; H03F 3/505; H03F 1/0261; H03F 1/0277; H03F 1/08; H03F 1/26; H03F 1/32; H03F 3/00
USPC ........... 381/104, 102, 28, 120, 121, 109, 321, 381/59, 192; 330/192, 144, 284; 333/81 R
See application file for complete search history.

(56) References Cited

U.S. PATENT DOCUMENTS 1,975,371 A * 10/1934 Place .............................. 330/189
2,096,027 A * 10/1937 Bode ........................... 333/28 R
(Continued)

FOREIGN PATENT DOCUMENTS

DE 202009004108 U1 8/2009
EP 1489748 A1 12/2004
JP 2001332946 11/2001

OTHER PUBLICATIONS

Unknown. LM4875 Boomer 750 mW Audio Power Amplifier with DC Volume Control and Headphone Switch. National Semiconductor Corporation. Jan. 2002.
(Continued)

*Primary Examiner* — Vivian Chin
*Assistant Examiner* — Leonard M Giannone
(74) *Attorney, Agent, or Firm* — McCarthy Tétrault LLP

(57) ABSTRACT

A circuit, device and method for controlling an output signal of an amplifier are provided. The output signal may be controlled through a first stage located before a digital to analog converter and/or a second stage located after it. The first stage boosts the digital signal to match with the full signal range of the converter. For the second stage, the circuit comprises: a first resistor coupled to an output of the amplifier in series, the first resistor having a resistance value Rs; a second resistor coupled to the first resistor in series, the second resistor having a resistance value Rp; and an output terminal for a transducer connected to the electronic device, the output terminal connected in parallel to the second resistor. In the circuit, the resistance values Rs and Rp are related by an inversely proportional relationship. The circuit provides an output signal at the output terminal having a noise floor that varies with an output level of the amplifier and a constant output impedance as seen from the transducer.

17 Claims, 10 Drawing Sheets

(56) References Cited

U.S. PATENT DOCUMENTS

| | | | | |
|---|---|---|---|---|
| 3,207,962 A * | 9/1965 | Slusher | ............... | 257/107 |
| 3,235,791 A * | 2/1966 | Miller | ............... | 323/345 |
| 3,254,304 A * | 5/1966 | Barret | ............... | 330/256 |
| 3,446,976 A * | 5/1969 | Shaw | ............... | 250/551 |
| 3,573,647 A * | 4/1971 | Antoniou | ............... | 330/69 |
| 3,629,567 A * | 12/1971 | Bruggemann | ............... | 708/835 |
| 4,048,576 A * | 9/1977 | Blackburn et al. | ............... | 330/284 |
| 4,052,678 A * | 10/1977 | Ramsland | ............... | 330/281 |
| 4,287,478 A * | 9/1981 | Berger | ............... | 330/256 |
| 4,424,499 A * | 1/1984 | Kiko | ............... | 333/28 R |
| 4,543,536 A * | 9/1985 | Pederson | ............... | 330/85 |
| 4,587,662 A * | 5/1986 | Langewellpott | ............... | 375/138 |
| 4,644,517 A * | 2/1987 | Tominari | ............... | 369/134 |
| 4,916,408 A * | 4/1990 | Stefani et al. | ............... | 330/255 |
| 5,218,643 A * | 6/1993 | Nagashima | ............... | 381/86 |
| 5,475,323 A * | 12/1995 | Harris et al. | ............... | 327/67 |
| 5,588,065 A * | 12/1996 | Tanaka et al. | ............... | 381/96 |
| 5,651,073 A | 7/1997 | Isu et al. | | |
| 5,675,277 A * | 10/1997 | Cooper et al. | ............... | 327/238 |
| 6,271,726 B1 | 8/2001 | Fransis et al. | | |
| 6,310,512 B1* | 10/2001 | Briskin et al. | ............... | 327/552 |
| 6,433,642 B1* | 8/2002 | Goyette | ............... | 330/304 |
| 6,597,613 B1 | 7/2003 | Becker et al. | | |
| 6,642,794 B2 | 11/2003 | Mulder et al. | | |
| 6,717,469 B2* | 4/2004 | Maruyama et al. | ............... | 330/254 |
| 6,958,655 B2 | 10/2005 | Shirai | | |
| 7,053,728 B2 | 5/2006 | Park | | |
| 7,065,219 B1* | 6/2006 | Abe et al. | ............... | 381/74 |
| 7,170,274 B2* | 1/2007 | Mukherjee et al. | ............... | 323/313 |
| 7,202,734 B1 | 4/2007 | Raab | | |
| 7,202,747 B2 | 4/2007 | Forse et al. | | |
| 7,295,061 B1* | 11/2007 | Dasgupta | ............... | 330/9 |
| 7,317,355 B2* | 1/2008 | Zhao et al. | ............... | 330/251 |
| 7,358,816 B2 | 4/2008 | Ryu et al. | | |
| 7,423,481 B2* | 9/2008 | Dias da Fonte et al. | ............... | 330/86 |
| 7,453,321 B2 | 11/2008 | Itkin et al. | | |
| 7,463,078 B2 | 12/2008 | Xu | | |
| 7,602,245 B2* | 10/2009 | You et al. | ............... | 330/251 |
| 7,629,846 B2* | 12/2009 | Oishi | ............... | 330/253 |
| 7,639,076 B2* | 12/2009 | Moon et al. | ............... | 330/86 |
| 7,800,441 B2* | 9/2010 | Mui et al. | ............... | 330/86 |
| 8,120,426 B1* | 2/2012 | Granger-Jones et al. | ............... | 330/260 |
| 2002/0158690 A1* | 10/2002 | Cheung et al. | ............... | 330/144 |
| 2003/0030507 A1* | 2/2003 | Yufu et al. | ............... | 333/81 R |
| 2003/0122623 A1* | 7/2003 | Maruyama et al. | ............... | 330/254 |
| 2003/0169104 A1 | 9/2003 | Huckins et al. | | |
| 2003/0218817 A1* | 11/2003 | Choi | ............... | 360/67 |
| 2004/0172242 A1* | 9/2004 | Seligman et al. | ............... | 704/225 |
| 2004/0201416 A1* | 10/2004 | Wyers et al. | ............... | 330/2 |
| 2006/0013410 A1* | 1/2006 | Wurtz | ............... | 381/74 |
| 2006/0028269 A1 | 2/2006 | Chen | | |
| 2006/0119399 A1 | 6/2006 | Tam | | |
| 2006/0245603 A1* | 11/2006 | Suzuki et al. | ............... | 381/104 |
| 2007/0032976 A1* | 2/2007 | Rzyski et al. | ............... | 702/111 |
| 2007/0126508 A1* | 6/2007 | Montemayor et al. | ............... | 330/284 |
| 2007/0155347 A1 | 7/2007 | Heuermann et al. | | |
| 2008/0197924 A1* | 8/2008 | Oishi | ............... | 330/144 |
| 2008/0197926 A1* | 8/2008 | Oishi | ............... | 330/253 |
| 2008/0246450 A1* | 10/2008 | Matyas et al. | ............... | 323/238 |
| 2009/0121390 A1* | 5/2009 | Hayashi et al. | ............... | 264/319 |
| 2009/0174496 A1 | 7/2009 | Van Bezooijen | | |
| 2009/0245541 A1* | 10/2009 | Wang | ............... | 381/121 |
| 2010/0026393 A1 | 2/2010 | Keerti et al. | | |
| 2010/0272293 A1* | 10/2010 | Oddoart et al. | ............... | 381/120 |
| 2010/0289578 A1* | 11/2010 | Cao | ............... | 330/251 |

OTHER PUBLICATIONS

Chu Moy. Headphone Frequently Asked Questions. Headwize. 2001. downloaded from http://gilmore2.chem.northwestern.edu/faqs.htm.

Unknown. Dual, NV Audio Potentiometers Provide Low-noise, Low-distortion Digital Volume Control. Dallas Semiconductor Maxim Integrated Products. 2006.

* cited by examiner

*400*

400(2)

CIRCUIT, SYSTEM AND METHOD FOR ISOLATING A TRANSDUCER FROM AN AMPLIFIER IN AN ELECTRONIC DEVICE

FIELD OF DISCLOSURE

The disclosure presented described herein relates to a circuit, system and method for producing an output signal from a circuit in an electronic device from a transducer connected to the circuit. In particular, the disclosure relates to a providing a buffer circuit for an output signal from an amplifier from a connected transducer, such as a speaker or headphone.

BACKGROUND

Current wireless handheld mobile communication devices perform a variety of functions to enable mobile users to stay current with information and communications. Such devices provide telephone communications (e.g. through cellular connections). The devices can also provide audio output for other applications (e.g. playing music and listening to the radio). The audio output may be provided through a speaker or through an external headset or speaker connected to the device.

A headset having a sensitivity equivalent to approximately 133 dB SPL/V (decibel sound pressure level/volt) is not uncommon. Such a sensitivity rating is general considered to be a high sensitivity rating. Low sensitivity headsets can be found having sensitivities in the range of between approximately 95 and 105 dB SPL/V; medium sensitivity headsets can be found having sensitivities in the range of between approximately 105 and 120 dB SPL/V; and high sensitivity headsets can be found having sensitivities in the range of between approximately 120 and 135 dB SPL/V.

When a high sensitivity headset is connected to an audio output circuit of an electronic device, one goal is to use the high sensitivities to lower the output (i.e. the volume level) requirements for the headset, while providing a tolerable playback volume output level for the user, typically in the range of between approximately 75 and 95 dB SPL. With high sensitive headphones, the volume output level may need to be lowered by between approximately 20 and 50 dB as compared to the maximum output volume, typically 1 Volt RMS. When such a significant attenuation is implemented using a digital output attenuator, excessive noise may exist in the output signal. This is true with systems having a constant (or nearly constant) noise floor provided from a digital-to-analog converter (DAC) in the circuit.

BRIEF DESCRIPTION OF THE DRAWINGS

Embodiments of the disclosure will now be described, by way of example only, with reference to the accompanying drawings, in which.

DETAILED DESCRIPTION OF AN EMBODIMENT

Figure 1:
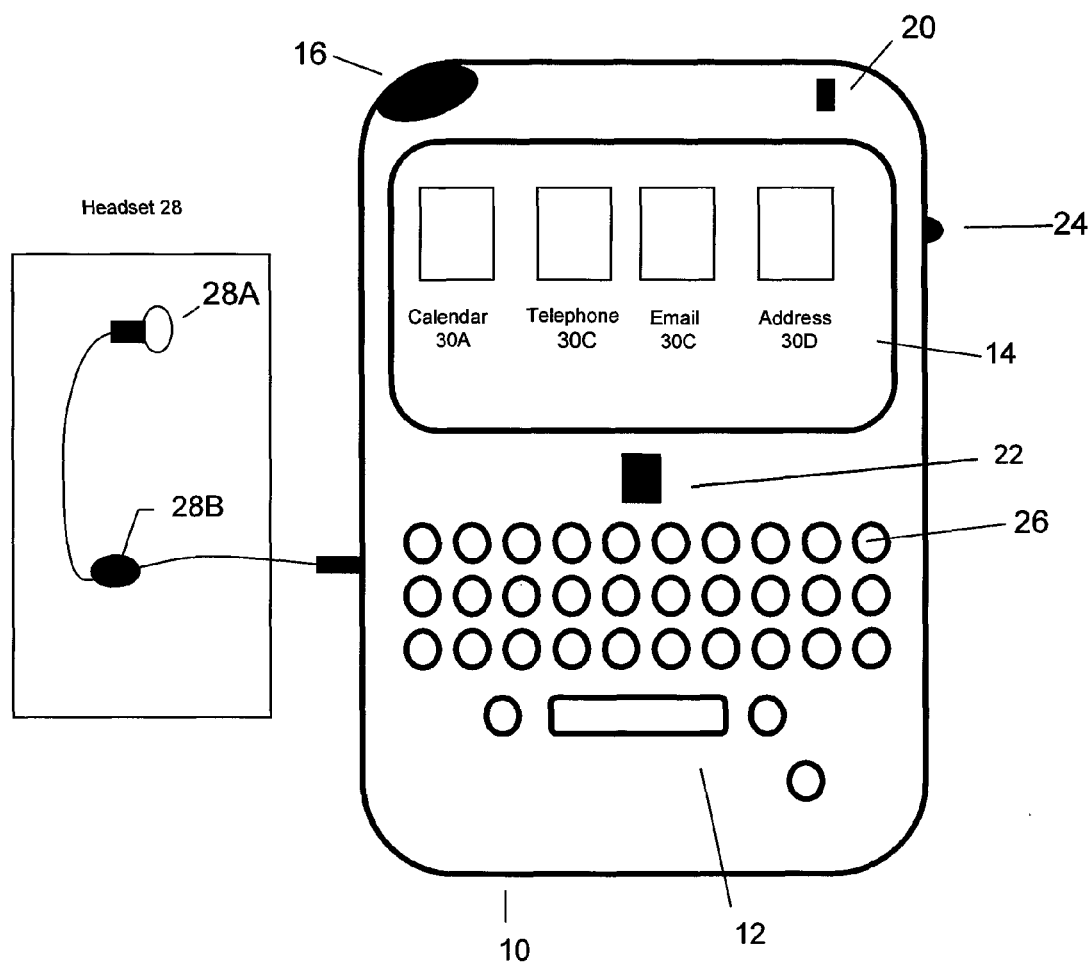
FIG. 1 is a schematic representation of an electronic device having output adjustment application and an output circuit in accordance with an embodiment.

The description which follows and the embodiments described therein are provided by way of illustration of an example or examples of particular embodiments of the principles of the present disclosure. These examples are provided for the purposes of explanation and not limitation of those principles and of the disclosure. In the description which follows, like parts are marked throughout the specification and the drawings with the same respective reference numerals.

In general, the discussion below is directed to a circuit, device and method for controlling an output signal of an amplifier. The output signal may be controlled through a first stage located before a digital to analog converter and/or a second stage located after it. In general, the first stage boosts the digital signal to match with the full signal range of the converter. After the second stage, the circuit provides an output signal at the output terminal having a noise floor that varies with an output level of the amplifier and substantially constant output impedance as seen from the transducer.

An aspect of an embodiment provides an electronic circuit for reducing the noise floor of an output signal from an amplifier in a radio frequency transmission circuit for a wireless communication device.

In a first aspect, an electronic circuit for an output signal of an amplifier in an electronic device is provided. The circuit comprises: a first resistor coupled to an output of the amplifier in series, the first resistor having a resistance value Rs; a second resistor coupled to the first resistor in series, the second resistor having a resistance value Rp; and an output terminal for a transducer connected to the electronic device, the output terminal connected in parallel to the second resistor. In the circuit, the resistance values Rs and Rp are related by an inversely proportional relationship.

The circuit may provide an output signal at the output terminal having a noise floor that varies with an output level of the amplifier.

In the circuit, the first resistor may limit current provided to the transducer from the electronic circuit; and the second resistor may reduce load impedance sensitivity for the transducer and act as a current shunt.

In the circuit, Rp may be equal to $Rs*a/(1-\alpha)$, where $\alpha$ is a non-zero constant.

In the circuit, Rp may be equal to $Rs*a/(1-\alpha)$, where $\alpha$ is a non-zero variable.

In the circuit, a value for $\alpha$ may relate to a preset attenuation value for the electronic circuit.

In the circuit, Rs may be set to a value between approximately 10Ω and 32Ω; and Rp may be set to a value between approximately 39Ω and 10 Ω.

In the circuit, the attenuation may be equal to $-20 \log(\alpha)$, where $\alpha$ is a non-zero value.

In the circuit, Rs may be equal to $Rx/\alpha$; and Rp may be equal to $Rx/(1-\alpha)$, where Rx is a reference series resistance used for the electronic circuit with no attenuation and $\alpha$ is an attenuation value.

In the circuit, an input of the amplifier may be connected to a programmable voltage divider circuit.

In the circuit, at least one of the first and second resistors may be a programmable resistor.

The electronic circuit may further comprise: a microprocessor; and instructions accessed through a memory device, the instructions operable on the microprocessor to set one or more values for the first and the second resistors, depending on a current output value of the electronic circuit.

The electronic circuit may further comprise a programmable voltage divider circuit connected in series to an input terminal of the amplifier. Therein, the instructions may further provide: a first value to the voltage divider when the electronic circuit is producing an output above a first threshold; and a value for the second resistor when the electronic circuit is producing an output below the first threshold.

In the electronic circuit, the voltage divider circuit and Rs and Rp may be programmed by the instructions to collectively dynamically attenuate signals of the amplifier.

In the electronic circuit, the transducer may be a headset; and the electronic circuit may be provided in a communication device.

In a second aspect, an electronic device is provided. The device comprises: a microprocessor; an amplifier; a first programmable resistor coupled to an output of the amplifier in series, the first programmable resistor having a resistance value Rs; a second programmable resistor coupled to the first resistor in series, the second programmable resistor having a resistance value Rp; a terminal for a transducer, the terminal connected in parallel with a circuit containing the second resistor; and memory containing instructions for the microprocessor to program resistance values for Rs and Rp. In the device, the resistance values Rs and Rp are related by an inversely proportional relationship.

The electronic device may further comprise a programmable voltage divider circuit connected in series to an input terminal of the amplifier.

In a third aspect a method for controlling an output signal of an electronic circuit for an amplifier in an electronic device is provided. The method comprises: boosting a digital value for the output signal to a boosted value to utilize available signal headroom for a digital to analog converter (DAC) connected to the electronic circuit; and providing an output attenuation circuit following the electronic circuit. The output attenuation circuit has a first resistor and a second resistor; a value for a first resistor is determined from an attenuation value identified for the electronic circuit and a value for the second resistor is determined from the attenuation value and the value for the first resistor. In the output attenuation circuit, the first resistor is coupled to an output of the amplifier in series, where the first resistor has a resistance value Rs; the second resistor coupled to the first resistor in series, where the second resistor has a resistance value Rp; and an output terminal for a transducer is connected to the electronic device, where the output terminal is connected in parallel to the second resistor.

The method may further comprise: utilizing a voltage divider circuit connected in series to an input terminal of the amplifier to provide an input attenuation stage for the electronic circuit; providing a first value to the voltage divider when the electronic circuit is producing an output above a first threshold; and providing a value for the second resistor when the electronic circuit is producing an output below the first threshold.

In another aspect, a method for controlling an output signal of an electronic circuit for an amplifier in an electronic device is provided. The method comprises: boosting a digital value for the output signal to a boosted value to utilize available signal headroom for a DAC connected to the electronic circuit; determining a value for a first resistor in the electronic circuit based on an attenuation value identified for the electronic circuit and determining a value for a second resistor in the electronic circuit based on the attenuation value and the value for the first resistor. In the circuit for the method, the first resistor is coupled to an output of the amplifier in series, the first resistor having a resistance value Rs; the second resistor coupled to the first resistor in series, the second resistor having a resistance value Rp; and an output terminal for a transducer is connected to the electronic device, the output terminal connected in parallel to the second resistor.

In other aspects, various combinations of sets and subsets of the above aspects are provided.

Generally, an embodiment includes an interface between an output of a module in an electronic device and a transducer which receives the output. The module may be an amplifier, such as an amplifier that generates audio signals. The transducer may be a speaker housed within the device, an external speaker or headphones (e.g. headsets) that may be selectively connected to the device. One aspect of an embodiment is to provide an output control that maintains a high dynamic range (for example, at least approximately 90 dB) for a noise floor over a wide dynamic range (e.g. over at least about a 30 dB gain range). An embodiment provides a circuit that limits current consumption, thereby reducing power consumption for the circuit. An embodiment may retain, increase or maximize output headroom for a circuit by providing an attenuation circuit (typically as an analog circuit) where a noise floor for the output circuit is related to the output level of the circuit. As such, for the transducer the embodiment provides a noise floor for the output signal that varies with the output level of the amplifier.

One aspect for an embodiment provides an interface for various types of headsets when they are connected to an audio output port on the device. When an input jack of a headset is connected to the terminal, the headset is connected to an audio port circuit for the device. Typically, when the headset is connected to the terminal, the user may initially turn down the output volume level for the headset. Since acoustic sensitivities of a typical headset is very high (e.g. over approximately 100 dB), this may result in a default acoustic output exceeding approximately 90 dB, a level which has been compared to the loudness of a motorcycle operating at a distance of approximately 25 feet from a listener. The decrease in the output level reduces the output level to a tolerable level.

The change in the output may be accomplished either through a dedicated volume control on the device, such as potentiometer, and/or through an adjustment made through a software function on the device. Additionally or alternatively, a combination of staged output adjustment applications may be provided. For example, an initial (e.g. small) attenuation may be provided by an analog volume control at the headset while more substantial adjustments may be provided by an analog or digital volume controls provided by the device through its software.

In an embodiment, attenuation (i.e. output control) of a level of a signal produced within the electronic device is provided at two exemplary stages in a circuit. A first attenuation control stage can be provided to a signal before a DAC.

A second attenuation control stage can be provided after the DAC. In another embodiment, combined analog and digital gain controls may be used, where the analog attenuation precedes an analog to digital converter (ADC) and digital attenuation follows the ADC.

The first and second stages can operate together or separately. An embodiment uses the first stage to control output levels from the DAC, so that the gain is set to a level where an optimum point for certain parameters (such as having the lowest distortion or a sufficiently low distortion below a threshold) and an optimum signal to noise ratio (such as having the highest signal to noise ratio or a sufficiently high level above a threshold) is reached. An embodiment uses the second stage to control the final output levels to the desired level, thereby minimizing the noise floor. The first stage, as it precedes the DAC, provides digital manipulation of the output data relating to the output signal(s) before the data is provided to the DAC. The second stage, as it follows the DAC, provides attenuation of the analog signal. The second stage can maintain a volume level at the DAC at a level which has minimum signal-to-noise ratio and distortion level for the output signal. As the analog volume control attenuates the signal both the signal and the noise floor may be decreased simultaneously thereby maintaining a finite dynamic range over a wider range of gain. Eventually the output level in the analog signal path reaches a noise floor (such as the lowest noise floor). At that point, digital signal processing in the first stage may be used to further attenuate the signal. The analog/digital signal control and attenuation may be provided in a circuit which utilizes a combination of one or more hardware and/or software elements. An embodiment also provides a method that implements the combined analog/digital signal attenuation processes described herein. In yet another embodiment, the combined volume control may be implemented in on a semiconductor (which may be implemented as a single chip or a set of chips) that controls digital and analog gains based on a single desired gain setting for each audio stream. The semiconductor may make the volume changes track simultaneously between the digital and analog attenuator in order to attempt to avoid any intermediate gain values and change gains either based on finite time steps or attempt to decrease audible clicks by changing volume when the audio content is low in amplitude or at or near zero. The finite steps may typically be volume changes that are 1 dB or smaller. Clicks may otherwise be encountered where for example, the digital volume control was first changed by several dB and afterwards the analog volume control was changed by a similar amount of attenuation but changed over a longer time, resulting in a short transient, where the volume change during this period, e.g. 10 ms, is significantly larger than 1 dB, producing an audible "click". Therefore, it is preferable that the analog and digital changes in volume should be as synchronized in timing as close as possible by an embodiment. An embodiment may change the parameters of either the first or second stage during operation of a circuit of a device. At that instance of the change in parameters, a corresponding change to the parameters of the other stage may be provided at about the same time. The parameters for the first and second stages may be set during production and/or testing of the device and may be set as the default parameters for those stages.

Exemplary details of embodiments are provided herein. First, a description is provided on general components of a device that incorporates an embodiment. Next, further detail is provided on exemplary features of a circuit for an embodiment.

Referring to FIG. 1, an electronic device for receiving electronic communications in accordance with an embodiment of the disclosure is indicated generally at 10. In the present embodiment, electronic device 10 is based on a computing platform having functionality of an enhanced personal digital assistant with cellphone and e-mail features. It is, however, to be understood that electronic device 10 can be based on construction design and functionality of other electronic devices, such as smart telephones, desktop computers pagers or laptops having telephony equipment. In a present embodiment, electronic device 10 includes a housing 12, a display 14 (which may be a liquid crystal display or LCD), speaker 16, a light emitting diode (LED) indicator 20, a touchpad 22, an ESC ("escape") key 24, keypad 26, a trackwheel (not shown), a trackball (not shown), a trackpad (not shown), an optical navigation module (not shown), a telephone headset 28 comprised of an ear bud 28A and a microphone 28B. Touchpad 22 and ESC key 24 can be inwardly depressed as a means to provide additional input signals to device 10.

It will be understood that housing 12 can be made from any suitable material as will occur to those of skill in the art and may be suitably formed to house and hold all components of device 10.

Device 10 is operable to conduct wireless telephone calls, using any known wireless phone system such as a Global System for Mobile Communications (GSM) system, Code Division Multiple Access (CDMA) system, CDMA 2000 system, Cellular Digital Packet Data (CDPD) system and Time Division Multiple Access (TDMA) system. Other wireless phone systems can include Wireless WAN (IMS), Wireless MAN (Wi-max or IEEE 802.16), Wireless LAN (IEEE 802.11), Wireless PAN (IEEE 802.15 and Bluetooth), etc. and any others that support voice. Additionally, a Bluetooth network may be supported. Other embodiments include Voice over IP (VoIP) type streaming data communications that can simulate circuit-switched phone calls.

Various applications are provided on device 10, including email, telephone, calendar and address book applications. A graphical user interface (GUI) providing an interface to allow entries of commands to activate these applications is provided on display 14 through a series of icons 30. Shown are calendar icon 30A, telephone icon 30B, email icon 30C and address book icon 30D. Such applications can be selected and activated using the keypad 26 and/or the touchpad 22.

Figure 2:
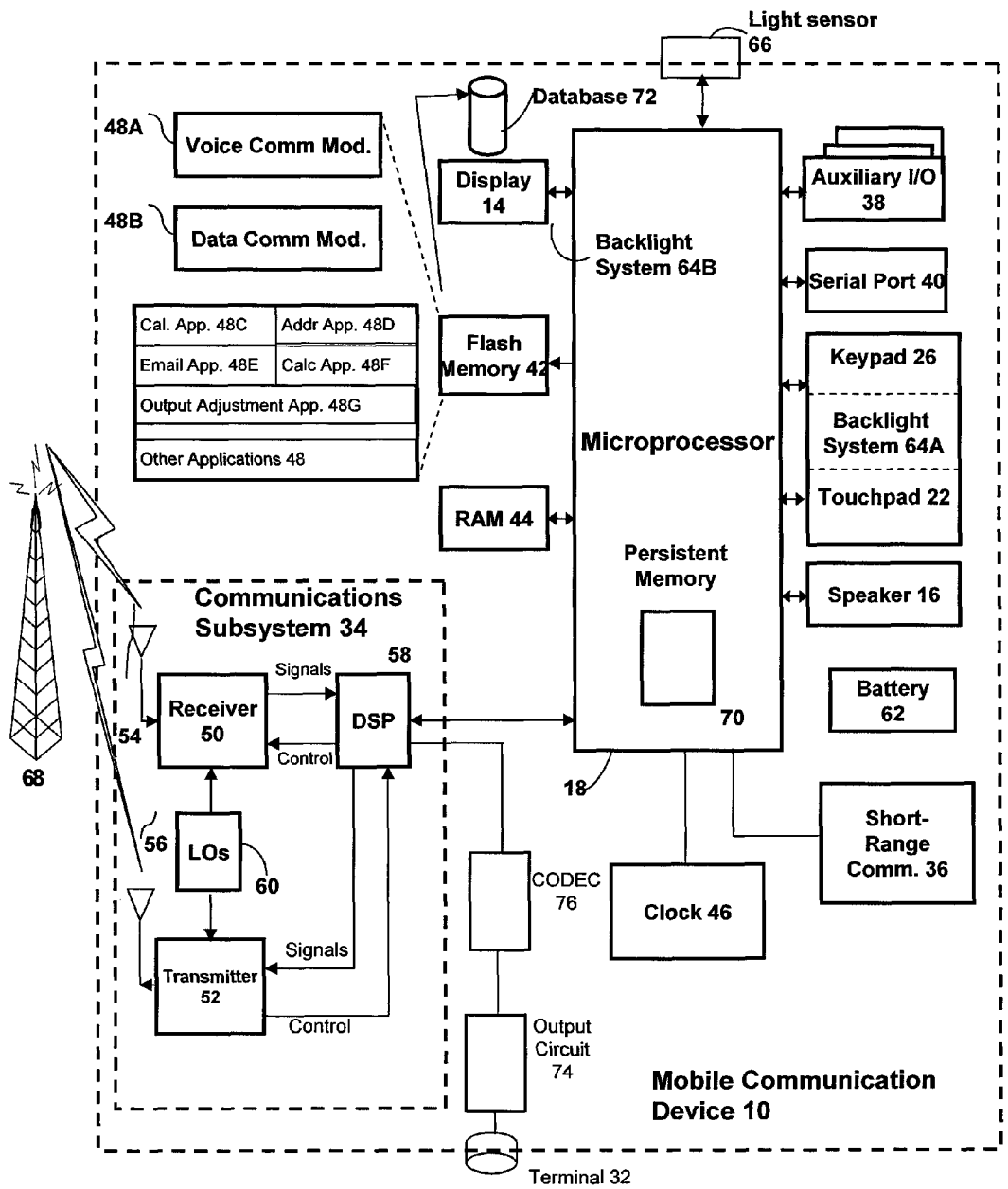
FIG. 2 is a block diagram of certain internal components, the output adjustment application and the output circuit of FIG. 1.

Referring to FIG. 2, exemplary functional elements of device 10 are provided. Functional elements are generally electronic or electro-mechanical devices. In particular, microprocessor 18 is provided to control and receive data, transmissions, inputs and outputs related to device 10 through programmed instructions provided to it. Microprocessor 18 is shown schematically as coupled to keypad 26, display 14 and other internal devices. Microprocessor 18 controls the operation of the display 14, as well as the overall operation of the device 10, in response to actuation of keys on the keypad 26 by a user. Microprocessor 18 preferably controls the overall operation of the device 10 and its components. Exemplary microprocessors for microprocessor 18 include microprocessors in the Data 950 (trade-mark) series, the 6200 series and the PXA900 series, all available at one time from Intel Corporation.

In addition to the microprocessor 18, other internal devices of the device 10 include: communication subsystem 34; short-range communication subsystem 36; keypad 26; and display 14; with other input/output devices including a set of auxiliary I/O devices through port 38, a serial port 40, a speaker 16 and a terminal (jack) 32 for headset 28 (FIG. 1); as well as memory devices including a flash memory 42 (which provides persistent storage of data) and random access memory (RAM) 44; clock 46 and other device subsystems (not shown). The device 10 is preferably a two-way radio frequency (RF) communication device having voice and data communication capabilities. In addition, device 10 preferably has the capability to communicate with other computer systems via the Internet.

Operating system software executed by microprocessor 18 is preferably stored in a computer readable medium, such as flash memory 42, but may be stored in other types of memory devices (not shown), such as read only memory (ROM) or similar storage element. In addition, system software, specific device applications, or parts thereof, may be temporarily loaded into a volatile storage medium, such as RAM 44. Communication signals received by the mobile device may also be stored to RAM 44. Database 72 may be provided in flash memory 42 to store images, variables and run time data relating to applications 48.

Microprocessor 18, in addition to its operating system functions, enables execution of software applications stored on device 10. A set of software applications 48 that control basic device operations, such as a voice communication application 48A and a data communication application 48B, may be installed on the device 10 during manufacture or downloaded thereafter.

Communication functions, including data and voice communications, are performed through the communication subsystem 34 and short-range communication subsystem 36. Collectively, subsystem 34 and subsystem 36 provide the signal-level interface for all communication technologies processed by device 10. Various other applications 48 provide the operational controls to further process and log the communications. Communication subsystem 34 includes receiver 50, transmitter 52 and one or more antennas, illustrated as receive antenna 54 and transmit antenna 56. In addition, communication subsystem 34 also includes a processing module, such as digital signal processor (DSP) 58 and local oscillators (LOs) 60. The specific design and implementation of communication subsystem 34 is dependent upon the communication network in which device 10 is intended to operate. For example, communication sub-system 34 of device 10 may operate with the Mobitex (trade-mark), DataTAC (trade-mark) or General Packet Radio Service (GPRS) mobile data communication networks and also operate with any of a variety of voice communication networks, such as Advanced Mobile Phone Service (AMPS), Time Division Multiple Access (TDMA), Code Division Multiple Access (CDMA), CDMA 2000, Personal Communication Service (PCS), Global System for Mobile Communication (GSM), etc. Other types of data and voice (telephonic) networks, both separate and integrated, may also be utilized with device 10. In any event, a communication sub-system (not shown) provides device 10 with the capability of communicating with other devices using various communication technologies, including instant messaging (IM) systems, text messaging (TM) systems and short message service (SMS) systems.

In addition to processing communication signals, DSP 58 provides control of receiver 50 and transmitter 52. For example, gains applied to communication signals in receiver 50 and transmitter 52 may be adaptively controlled through automatic gain control algorithms implemented in DSP 58.

In a data communication mode a received signal, such as a text message or web page download, is processed by communication subsystem 34 and is provided as an input to microprocessor 18. The received signal is then further processed by microprocessor 18 which can then generate an output to display 14 or to auxiliary I/O port 38. A user may also compose data items, such as e-mail messages, using keypad 26, touch-pad 22, or a thumbwheel (not shown), and/or some other auxiliary I/O device connected to port 38, such as a touchpad, a rocker key, a separate thumbwheel or some other input device. The composed data items may then be transmitted over communication network 68 via communication subsystem 34.

In a voice communication mode, overall operation of device 10 is substantially similar to the data communication mode, except that received signals are output to speaker 16 or ear bud 28A (FIG. 1), and signals for transmission are generated by microphone 28B. Alternative voice or audio I/O subsystems, such as a voice message recording subsystem, may also be implemented on device 10.

Short-range communication subsystem 36 enables communication between device 10 and other proximate systems or devices, which need not necessarily be similar devices. For example, the short-range communication subsystem may include an infrared device and associated circuits and components, or a Bluetooth (trade-mark) communication module to provide for communication with similarly-enabled systems and devices.

Powering the entire electronics of the mobile handheld communication device is power source 62 (shown in FIG. 2 as a battery). Preferably, power source 62 includes one or more batteries. More preferably, power source 62 is a single battery pack, especially a rechargeable battery pack. A power switch (not shown) provides an "on/off" switch for device 10. Upon activation of the power switch an application 48 is initiated to turn on device 10. Upon deactivation of the power switch, an application 48 is initiated to turn off device 10. Power to device 10 may also be controlled by other devices and by internal software applications.

One or more of keys 26 may also be backlit by backlight system 64A, especially under low-light conditions. Display 14 has backlight system 64B (not shown) to assist in the viewing display 14.

Light sensor 66 is provided on device 10. Sensor 66 is a light sensitive device which converts detected light levels into an electrical signal, such as a voltage or a current.

Headset 28 (FIG. 1) may be connected to device 10 through terminal 32. Terminal 32 provides physical connections between terminals of headset 28 (for one or more of its speaker 28A and/or microphone 28B) and input/output circuits in device 10. Output circuit 74 provides an interface for output signals being generated on device 10 (e.g. audio signals from music files stored on device 10, audio signals from received telecommunications by device 10, etc.) and external transducers, such as headset 28, connected to terminal 32. Output circuit 74 may also provide an interface between input signals (e.g. audio signals from microphone 28B in headset 28) for device 10 from external devices connected to terminal 32. In one embodiment, digital signals (e.g. for audio files) are processed by DSP 58, which feeds the signals to CODEC 76, which then provides the signals to output circuit 74. A buffer circuit (not shown) may be provided between DSP 58 and CODEC 76 to store digital information from DSP 58 and selectively provides same information delayed to CODEC 76. Further detail on features of output circuit 74 are provided below.

Brief descriptions are now provided on the applications 48 stored and executed in device 10. The applications may also be referred to as modules and may include any of software, firmware and hardware to implement a series of commands and instructions to carry out their functions. Voice communication application 48A and data communication application 48B have been mentioned previously. In some embodiments, one or more communication processing functions may be shared between applications 48A and 48B.

Additional applications include the following applications. Calendar 48C application tracks appointments and other status matters relating to a user and device 10. It is activated by activation of calendar icon 30A on display 14 (FIG. 1). Address book 48D enables device 10 to store contact information for persons and organizations. Address book 48D is activated by activation of address book icon 30D on display 14 (FIG. 1). Names, addresses, telephone numbers, e-mail addresses, cellphone numbers and other contact information is stored. Email application 48E provides modules to allow a user of device 10 to generate email messages on device 10 and send them to their addressees. Application 48E also provides a GUI which provides a historical list of emails received, drafted, saved and sent. Text for emails can be entered through keypad 26. Email application 48E is activated by activation of email icon 30C on display 14 (FIG. 1). Calculator application 48F provides modules to allow a user of device 10 to create and process arithmetic calculations and display the results through a GUI.

Output adjustment application (OAA) 48G provides control signals to adjust the output level for headphone 28A. OAA 48G may operate to control one or more parameters of output circuit 74, CODEC 76 and/or DSP 58 when generating a signal and controlling an output level for terminal 28. OAA 48G may be used to control the volume controls inside the DSP, inside the CODEC, after the CODEC, inside the headphone amplifier or after the headphone amplifier or in a combination of these for optimizing the dynamic range and minimizing noise. OAA 48G may be provided as an embedded application within an operating system for device 10. Alternatively, OAA 48G may be a separate, user-accessible, application. OAA 48G allows a user or another application to adjust output levels for one or more transducers connected to or embedded in device 10. Other applications operating on device 10 may generate requests to OAA 48G to adjust an output level for a component. OAA 48G can generate an appropriate signal, such as a pulse width modulation (PWM) signal or values for a PWM signal, that can be used to drive an output signal for the component. A GUI may be provided to allow the user of device 10 to use OAA 48G to input/change its operating parameters.

Further detail is now provided on aspects of an embodiment relating to a system and method for controlling an output level of a module for device 10. One aspect of an embodiment provides an output circuit that has an approximately constant dynamic range over a wide frequency range of signals (e.g. over at least the voice band frequencies). To an external transducer connected to the output circuit, the output circuit appears to have a constant output impedance, regardless of the impedance of the transducer itself. Another aspect provides a lowered noise floor (with an improved signal/noise ratio) when the output circuit is controlling low-level output signals. The constant dynamic range may also be obtained first by using wide range analog attenuation for low attenuation. This is followed by digital attenuation for higher values of attenuation when the noise floor of the output terminal 32 (FIG. 2) is equivalent to the ambient noise floor or lower (taking the transducer sensitivity into account).

For determining operation parameters of a wide-band attenuator and a low signal attenuator, an embodiment provides the following processes. First, a determination is made of the total dynamic range of the output for the circuit. Next, a determination is made for the resolution of steps within the range. This defines the number of volume levels in within the range. Finally, based on an attenuation circuit (described below), calculations are made to generate the specific values for resistive components in the circuit to populate the circuit. The disclosure provides an wide band attenuator through the circuit below that has a fall off in attenuation values at low output levels.

As such, for an output circuit controlled by digital components (such as in device 10), digital components in device 10 are providing the signals to control the output levels for the transducer. However, at high output levels (or levels above a noise floor), the attenuator circuit provides the dominant effect on attenuating the output level of the circuit, which provides the main volume control, even as device 10 is providing digital control of the output signals. However, at the noise floor, the characteristic of the attenuator circuit is that when the noise floor has been reached, any further attenuation will typically be provided through signal processing in the digital domain, in order to minimize circuit complexity. As such, at the noise floor, the volume control is effectively provided by the upstream digital control signals.

One embodiment provides improved output control for signals being processed by a DAC, such as inside a coder/decoder (CODEC). An embodiment utilizes signal processing before the DAC and an output circuit following the DAC to control the output level, namely attenuate the output signal, responsive to output control signals provided to the circuit. For example, for a headphone control circuit, an embodiment will process the headphone output signals before being provided to a DAC and will further process the post-DAC signals through an analog circuit to provide volume control for the headphone. While the digital signal processing and the analog circuit both control attenuation of the output level(s) of the circuit, the two processes can work independently of each other. Alternatively one process/module can be provided to accommodate for frequency response characteristics of the other module/process. A feature of an embodiment is to provide an output having a high dynamic range over a wide range of attenuation.

With some general features of an embodiment described, further detail is provided on aspects of an embodiment.

Figure 3:
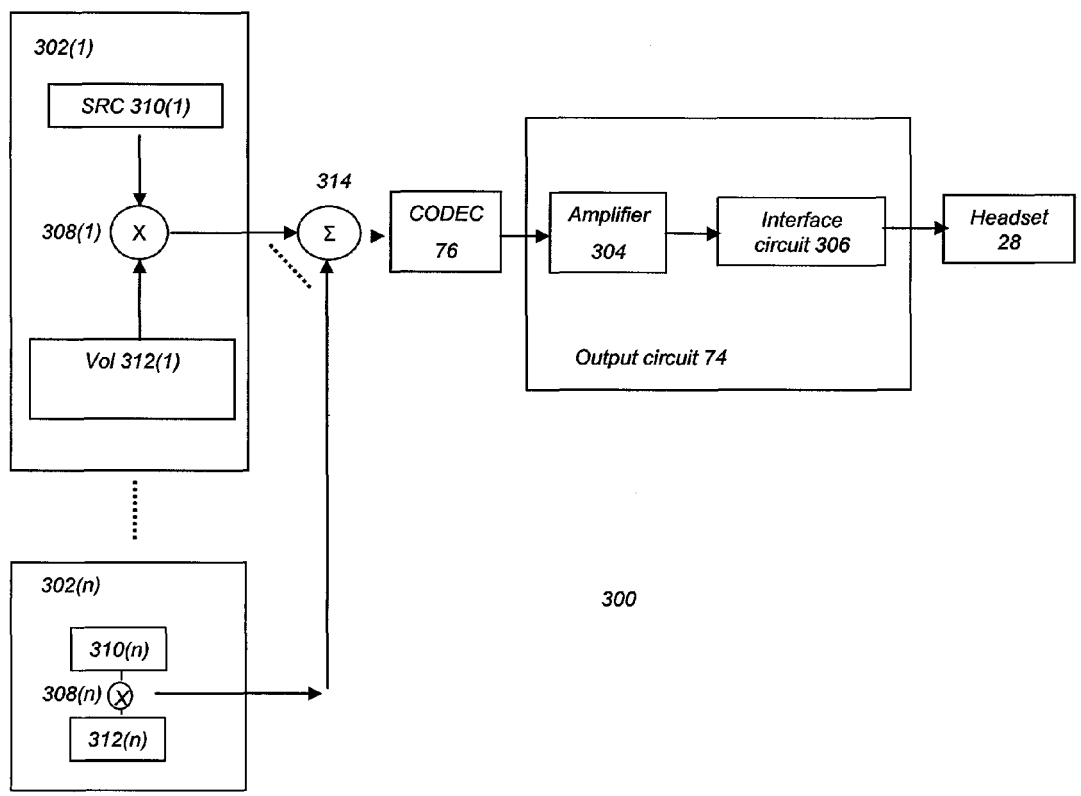
FIG. 3 is a block diagram of aspects of the output adjustment application and the output circuit of the device of FIG. 1.

Referring to FIG. 3, circuit 300 provides two stages of attenuation control for CODEC 76. For the first stage, digital control module 302 is provided inside CODEC 76 and provides data manipulation of the digital output signal. For the second stage, output circuit 74 controls attenuation of an analog signal generated from CODEC 76. The first and second stages are discussed in turn.

For the first stage, digital control module 302 has a source input signal (SRC 310) and a corresponding output volume control signal (VOL 312). The resultant signal is combined digitally in summing module 308. The volume control may act to attenuate or to amplify the digital signal. The source signal may (or may not) be attenuated or amplified (as its digital representation) before being provided to summing module 308. There may be multiple modules 302(*n*) provided where each module 302(*n*) has a separate input signal SRC 310(*n*), volume control signal VOL 312(*n*) and summing module 308(*n*). Signals from all modules 302 are provided to summing module 314 which sums all signals (digitally) and then provides the resultant net digital value to CODEC 76. For example for a headphone circuit, a source input signal may be a music file and the volume control may be a headphone output. Multiple input sources may be paired with corresponding multiple output control signals. Multiple sources may be involved where a telephone call output signal is combined with a music file. The digital control module may be implemented in processed embedded in output adjustment module 48G.

For the second stage, one embodiment provides the second stage in output circuit 74 as an operational amplifier ("op amp") 304 and interface circuit 306. Op amp 304, e.g. device MAX97200 (trade-mark) from Maxim Semiconductor, provides an amplification circuit for audio signals destined for the output device (e.g. headset 28) connected to output circuit 74.

Output circuit 74 may be implemented as a silicon circuit using polysilicon or other on-chip resistors to define the resistor values and using NMOS/PMOS switches to define which resistors are used. Other circuits using discrete components may also be implemented. Interface circuit 306 provides the final physical interface for output circuit 74 to headset 28. Circuit 306 may include the physical jack to receive the input plug of headset 28. A signal may be applied to headset 28 when headset 28 is connected to interface circuit 306 via terminal 32 (FIG. 2).

Figure 4A:
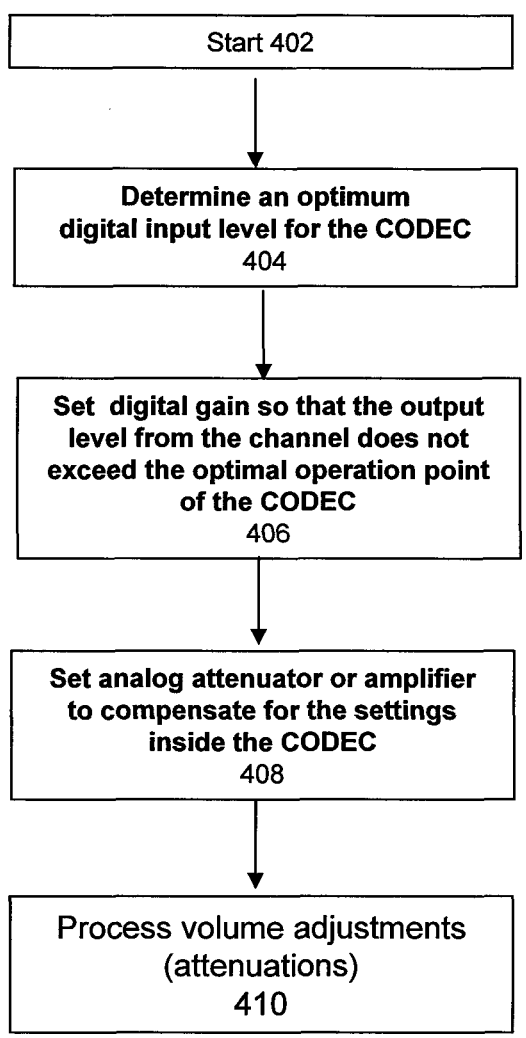
FIG. 4A is a flow chart of an exemplary process used to modify digital signals by the output adjustment application of FIG. 1.

In one embodiment, output circuit 74 provides isolation and attenuation of output signals to headset 28. In one embodiment, op-amp 304 may provide a dynamic range of approximately 108 dB. An embodiment allows control of the output signal from op amp 304. One output control element is provided following op amp 304. FIG. 4A shows the output of op amp 304 is connected to a resistive attenuator network, as provided in circuit 306. One configuration for circuit 306 provides approximately between 0 and 60 dB output attenuation to the signal and approximately between 0 and 20 dB of attenuation of the input signal before applying it to amplifier 304. More or less attenuation may be provided in other embodiments. In low output signal conditions, the noise floor associated with circuit 74 is decreased as analog circuit Rs and Rp attenuates both the signal and the noise. In yet another embodiment, operational amplifier 304 provides attenuation of the output signal instead of an external resistive divider. Such an implementation provides a balance of improved power efficiency and against noise level performance.

One or more additional (analog) attenuation stage(s) may be added in other embodiments either before or after op amp 304. As part and/or adjunct to interface circuit 306, a resistive network may be implemented to provide attenuation of signals for circuit 74. The network may be implemented as a resistor or a set of resistors provided in series and/or parallel. As described herein, elements are "in series" if substantially the same current flows through them. Elements may be deemed to be in series even if the current flowing through them is not exactly the same, such as when a node between the first element and the second element, enables a negligible amount of current to flow through a third element. The first and second elements would be deemed to be "in series: because the current flowing through them would be substantially the same. Similarly, elements are "in parallel" if they experience substantially the same voltage between two nodes. Once again, the voltages need not be exact, and the two elements in parallel need not necessarily be coupled to exactly the same nodes. For purposes of simplicity of description, elements in series may be depicted as being strictly in series, and elements in parallel may be depicted as being strictly in parallel. Further, as is well known, a single resistor can be made up of multiple resistor elements, but for simplicity, a resistor will be assumed to be and depicted as a single resistor. A selection of the values for the resistors and the type of circuit will determine the attenuation provided by the resistors. The resistive network may be selectively coupled to the module when the output has been decreased by between approximately 10 and 20 dB by regulating the input level to the amplifier. It will be appreciated that at this output power level, namely between approximately 10 and 20 dB below a full scale output for headset 28, power lost in the load resistors in the resistive network will be relatively small compared to the power level of the full circuit. As such, for the headset the embodiment provides an output signal that has a noise floor that varies with the output level of the amplifier.

As such, while power efficiency for the circuit will be lower for these relatively low volume settings, the total power loss is relatively small. A typical attenuation for low sensitivity headsets is between about 0 and 30 dB; for medium sensitivity headsets a typical attenuation is between about 10 and 45 dB; and for highly sensitive headsets, a typical attenuation is between about 25 and 60 dB.

In another embodiment, output circuit 74 provides a load-independent buffer through a resistive divider network, which may provide constant gain steps regardless of load impedance values. This type of set up may be suitable for low noise or general amplification applications.

Further detail is now provided on the first stage of signal control provided in FIG. 3. Referring to FIG. 4A, process 400 illustrates an exemplary process used to provide improved headroom performance for controlling an output. Briefly, an input signal's value is boosted before being provided to a DAC inside CODEC 76. In this embodiment, the input signals before the DAC inside CODEC 76 are in the digital domain. As such, the digital signals are boosted before the DAC inside CODEC 76 and then they are allowed to be attenuated by downstream modules. As previously noted signals from the DAC inside CODEC 76 can be attenuated using an analog volume control. An embodiment maintains a volume level inside CODEC 76 which has suitable signal-to-noise ratio and distortion level for the output signal. As with many analog circuits, there is a noise floor associated with it. By boosting the original digital input signal, the relative gain of the input signal over the noise floor has been increased. The analog/digital signal control and attenuation may be provided in a circuit which utilizes a combination of one or more hardware and/or software elements.

Process 400 is suitable for adjusting the digital output level of one output source (SCR 1) having one volume control (VOL 1), per FIG. 3. In processing the digital signal of the input signal, the following processes are performed. At block 402, process 400 starts. At block 404, a determination is made of a maximum digital input level for the DAC inside CODEC 76 for optimal operation of CODEC 76. The maximum input level is typically specified as 0 dBFS (dB full scale). For optimum operation, one embodiment is between approximately 1 and 2 dB below 0 dBFS, namely at approximately −1 to −2 dBFS. In another implementation, an optimum volume setting may be between approximately 0.5 and 6 dB below the maximum allowed value. An optimum value may be selected for a given DAC depending on its performance characteristics. The optimal operation may consider one or more of the best signal to noise and distortion (SINAD) level, the best signal to noise ration (SNR), the best distortion performance, or other parameters. (For the sake of brevity of for this disclosure, operating points described herein as the "maximum", "best" or "optimum" are understood to include the best, maximum and/or optimum determined operating point as well as operating points that pass a certain threshold, unless otherwise noted. Similarly, "minimum" and "zero" operating points may be comparably determined with additional points passing a minimum or zero value threshold.) Next, at block 406, the digital gain for the input signal is set to be at the optimum input level for the DAC inside CODEC 76. This ensures that the best possible operating point of CODEC 76 is being used and that the optimum operating point of CODEC 76 is not exceeded. As an adjustment in block 406, instead of using the absolute maximum input level, process 400 will typically adjust the digital gain to provide some headroom between the maximum input signal and the maximum range of CODEC 76. This reduction assists in avoiding clipping of the output signal and operating the DAC at a suitable performance point, which may be the best possible performance point or a level that surpasses a provided threshold. The reduction may be in absolute terms (e.g. in dB) or in relative terms compared to the output signal (e.g. a percentage of the output signal) or some combination of both. With the maximum gain level set for the input signals, downstream adjustments can be made to the output level of the circuit. As the input signal has been boosted, generally, an embodiment provides an attenuation of the signal to provide output control at process 408.

The process of adjusting the (digital) output level for input signals can be done at any time. Adjustments may be made when a determination is made that different output levels are being processed. For example, if it is determined that the maximum output level for a signal will not exceed a certain level, then process 400 can be performed to determine a suitable gain for that output level. However, if later it is determined that the output level for that signal has changed (either upwards or downwards), then a different appropriate gain may be determined.

Figure 4B:
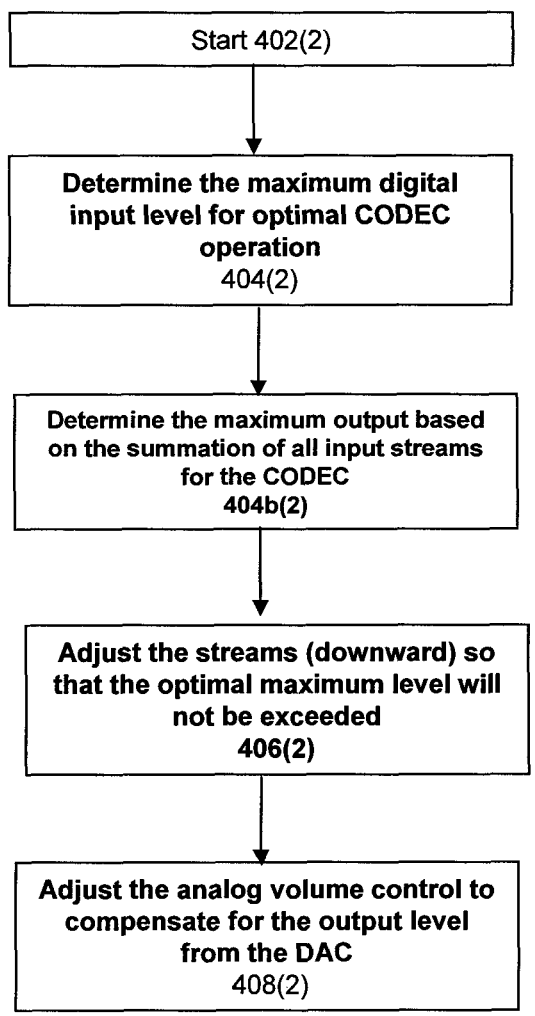
FIG. 4B is a flow chart of an exemplary process used to modify multiple digital signals by the output adjustment application of FIG. 1.

As a modification to general features of process 400, FIG. 4B, shows process 400(2), which illustrates an exemplary process used to provide improved headroom performance for controlling multiple outputs (e.g. output from a telephone call with output of a music file with output of audible enunicators, etc.). Briefly, for all of the output signals being combined, the resultant output signal is still boosted to use a suitable possible operating point for the input side of CODEC 76 (which may be the best determined operating point or an operating point that passes a certain threshold) and to reduce influence of EMI outside CODEC. However, relative output levels among sources from the original signals may need to be respected. The relative levels may be maintained as an absolute value (e.g. in dBs) or as a relative value (e.g. percentage of one output level to another output level). At block 402(2), process 400(2) starts. At block 404(2), a determination is made for the maximum digital input level for optimal CODEC 76 operation, which may relate to the "best" SINAD, SNR, distortion level, etc. At block 404b(2), a determination is made for the maximum output based on the summation of all input streams. Next, at block 406(2) an adjustment is made to these streams downward so that the optimal maximum level will never be exceeded. As such, the digital gain for the summed output signals is set to be at the optimum input level for CODEC 76. Again, as an adjustment in block 406(2), instead of using the optimum input level, process 400(2) may downwardly adjust the digital gain to provide some headroom between the maximum input signal and the optimum range of CODEC 76 to avoid clipping when multiple digital sources are added. This reduction assists in reducing distortion of the output signal. The reduction may be in absolute terms (e.g. in dB) or in relative terms compared to the output signal (e.g. a percentage of the output signal) or some combination of both. Typically, the source with the largest volume setting will be set to a level near the optimum operating point, adjusted for the additional amplitude from the other sources and afterwards the other sources will be adjusted with respect to this source. With the optimum gain level set for the input signals, downstream adjustments can be made to the output level of the circuit to compensate for the output level from the DAC at process 408(2). This will happen either in the headphone output amplifier or after this system component.

In processing two exemplary streams, process 400(2) would perform the following calculations in process 406(2):
1) Calculate the maximum possible amplitude of both streams (stream 1 and stream 2) when added together.
2) If (stream 1>stream 2), then set signal 1 to an optimum value for the CODEC, while correcting this to a smaller value to avoid distortion due to source 2. Stream 2 will be corrected to have the same difference to stream 1 as before the correction. A check can be made to ensure absolute value of both streams is correct.
3) If (stream 2>stream 1) then set signal 2 to an optimum value for the CODEC, while correcting this to a smaller value to avoid distortion due to source 1. Stream 1 will be corrected to have the same difference to stream 2 as before the correction. A check can be made to ensure absolute value of both streams is correct.
4) A correction may be provided for the lower limit of the analog gain as follows. When the desired output attenuation is higher than possible by the amplifier's or output attenuator, the stream can be adjusted digitally to give a lower output level.
5) A final check can be made for against the maximum gain for the output amplifier. If it exceeds the maximum output level, then the output level is set to the maximum level.

These processes can be implemented in output adjustment application 48G.

Figure 5A:
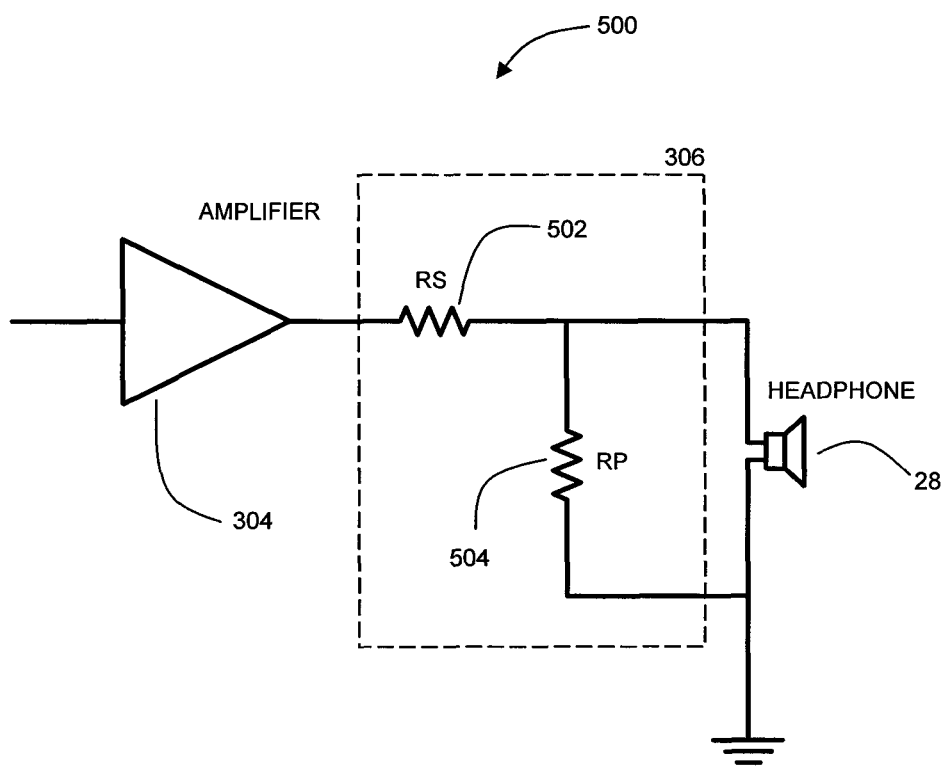
FIG. 5A is a schematic diagram of a first embodiment of the output circuit of FIG. 3.

With details provided on the first (digital) process stage of FIG. 3, further detail is provided the second (analog) stage, as shown in exemplary circuit 74. Referring to FIG. 5A, (AC) output voltages from a source with finite output impedance generally vary with different loads attached. An embodiment provides a circuit 500 for reducing noise level of an output signal from audio amplifier 304. Audio amplifier 304 may be a non-inverting amplifier, an inverting amplifier and may or may not have unity gain. The gain and/or attenuation of the input signal will typically be programmed by opening or closing switches that determines the gain/attenuation of this system component by selecting different resistors in the feedback path. By using an operational amplifier with wide attenuation range, a system with high efficiency and low noise may be obtained. The output of amplifier 304 is provided to interface circuit 306 (FIG. 3) comprising resistors 502 and 504. Amplifier 304 is coupled to resistor 502 in series. Resistor 502 is coupled to resistor 504, which is coupled to ground. Resistors 502 and 504 are noted as resistances Rs and Rp, respectively. Terminal 32 (FIG. 2) is connected in parallel to resistor 504. When a load (e.g. headset 28) is attached to the terminal 32, the circuit is complete and headset 28 (which may be considered to be a resistive load for circuit 500) is coupled in parallel with resistor 504. In other embodiments, one or more resistors may be provided where resistor 502 is located and one or more resistors may be provided where resistor 504 is located. Also, headset 28 may be connected with additional passive and/or reactive elements. Additional passive and/or reactive elements may be provided along any path in circuit 500. In an embodiment, circuit 500 provides a constant and but finite, output impedance as a reference. The finite impedance provides constant gain steps for different attached loads. Analog attenuation may typically provide at least approximately 10 dB or more of attenuation, in order to gain the benefits of improved EMI reduction and lower noise when using separate CODEC and interface blocks, though other choices may be made depending on a preference for either noise requirements or reduced power consumption characteristics.

Figure 5B:
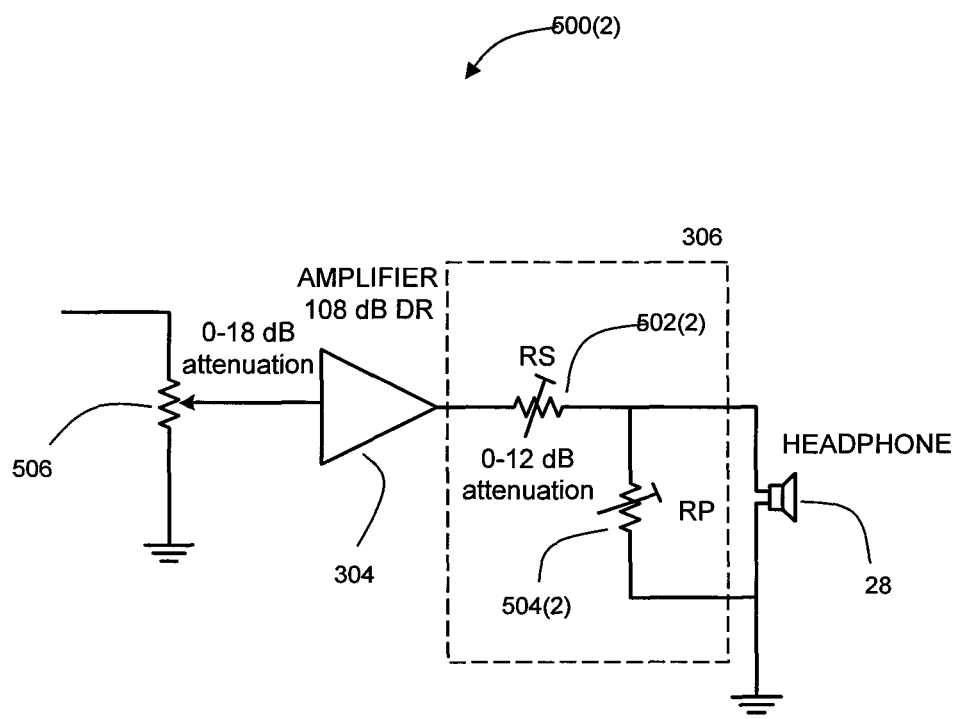
FIG. 5B is a schematic diagram of a second embodiment of the output circuit of FIG. 3.

FIG. 5B illustrates another embodiment showing circuit 500(2), where an input attenuator is provided to supplement the interface circuit 306. For the input attenuator, amplifier 304 is coupled to a programmable voltage divider 506 in series, which is coupled to ground. The voltage divider may be implemented as a variable resistor with an output tap that can be aligned at different resistance points. As such divider 506 provides a variable resistance. An output tap from divider 506 is provided to amplifier 304. Divider 506 may be electronically or manually controlled to change its voltage divider value. As such, divider 506 changes the amount of current and voltage provided to amplifier 304. Divider 506 is an input attenuator for circuit 500(2) and serves to provide a mechanism for attenuating the first portion of an output signal (i.e. the first coarse adjustment for the output signal). For example if a signal has a range of approximately 0 to 100 dB, divider may be used to control attenuation for a first range from the current output level for the device.

The output of amplifier 304 is provided to interface circuit 306 (FIG. 3) comprising resistors 502(2) and 504(2), as before. Amplifier 304 is coupled to resistor 502(2) in series. Resistor 502(2) is coupled to resistor 504(2), which is coupled to ground. Resistors 502(2) and 504(2) are noted as resistances Rs and Rp, respectively. Terminal 32 (FIG. 2) is connected in parallel to resistor 504(2). When a load (e.g. headset 28) is attached to terminal 32, the circuit is complete and headset 28 is coupled in parallel with resistor 504(2). Divider 506 and resistors 502(2) and 504(2) may each be a semiconductor based programmable device (such as a resistor, including a polysilicon or metal oxide (MOS) resistor). In this configuration an application (such as OAA 48G) may provide instructions and access data to set the resistance values of divider 506 and resistors 502(2) and 504(2). In other embodiments, one or more resistors may be provided where divider 506 or resistor 502(2) is located and one or more resistors may be provided where resistor 504(2) is located. Also, headset 28 may be connected with additional passive and/or reactive elements when bridging resistor 504(2). Additional passive and/or reactive elements may be provided along any path in circuit 500(2).

For FIG. 5B, since divider 506 is located before op amp 304, when the signal is attenuated by divider 506, the resulting smaller output is closer to the noise floor of op amp 304. However, since divider 506 is used primarily for the first portion of signal attenuation (e.g. for approximately the first 0-18 dB of attenuation), the noise floor cannot generally be noticed as the signal is being attenuated by divider 506.

Now, further detail is provided on specific implementations of circuits 500 and 500(2), in particular, detail is provided on algorithms for establishing exemplary values for Rs and Rp. Through calculations shown below, Table A shows values for Rs and Rp that may be used for an embodiment for circuits 500 and 500(2). The noted attenuation value is the amount of attenuation (in dB). For a given desired attenuation level in the volume (e.g. approximately −2 dB, −4 dB, etc.) the paired values of Rs and Rp in the corresponding columns may be used. For example, when a −2 dB attenuation level is desired as the output to headset 28, then for circuit 500, Rs should be set at approximately 10.0714 ohms and Rp should be set at approximately 38.8969 ohms. The values can be set of approximate resistance values from the functions, e.g. resistance values rounded to the first decimal point (e.g. to 38.9 ohms) or less precise values (i.e. first digit, to 39 ohms, or other tolerances). The different values of Rs and Rp may be provided via a silicon-based programmable resistor, where the values may be selected inside the related silicon chip by (electronic) switches implemented using NMOS/PMOS transistors.

TABLE A

| Attenuation [dB] (compared to reference level) | Ideal values | |
|---|---|---|
| | Rs [Ω] | Rp [Ω] |
| 0.00 | 8.00 | ∞ |
| −2.00 | 10.0714 | 38.8969 |
| −4.00 | 12.6791 | 21.6777 |
| −6.00 | 15.9621 | 16.0381 |
| −8.00 | 20.0951 | 13.2914 |
| −10.00 | 25.2982 | 11.6998 |
| −12.00 | 31.8486 | 10.6836 |

As shown, for an attenuation of between −2.00 dB and −12.00 dB, Rs has a value of between approximately 10Ω and 32Ω and Rp has a value of between approximately 39Ω and 10 Ω.

Rs, as placed in series prior to headset 28, affects the current that is provided to headset 28. A larger value of Rs limits more current to headset 28. Rp, as placed in parallel to headset 28, reduces the load impedance sensitivity of headset 28 for circuits 500/500(2). A smaller value of Rp may effectively makes the load impedance sensitivity to be close to, or effectively at, zero. An embodiment also provides an inverse relationship, specifically a hyperbolic relationship, in the value of Rs to Rp. In particular, in one embodiment the values of Rs and Rp may be calculated from the following functions:

$$Rs = Rx/\alpha \qquad \text{Equation 1}$$

$$Rp = Rx/(1-\alpha) \qquad \text{Equation 2}$$

where Rx is the series resistance used with no attenuation (providing a reference value) and α is the desired attenuation in absolute value, i.e. attenuation=−20 log(α). For example, an attenuation of 2 dB results in a having a value of 0.7943. In Table A shown, Rx=8Ω. It can be seen that Rs and Rp are related to each other in an inversely proportional manner. Generally, for the purposes of an example and not limitation, the inverse proportionality relationship between Rs and Rp is that as one value (e.g. Rs) increases, the other value (e.g. Rp) decreases. Here α is a scaling factor for the relationship. Other scaling factors and offsets can also be provided. In other embodiments, an inverse proportional relationship may include step-wise function(s) where changes in one value impart a change on the other only after a certain change threshold is reached.

For an embodiment and Table A, the individual attenuation steps shown therein may be set and calculated for a given application. If many attenuation steps are required, then, an embodiment may use many resistors and many switches. An embodiment may use a few (e.g. 1, 2 or 3) steps, e.g. one step or a few large steps such as 0 and −12 or 0 and −20 dB, and implement additional attenuation stages elsewhere.

It is noted that the minimum value of Rs is not zero. As such, there may be a small signal attenuation associated with this embodiment. A finite (and small) value for Rs has been provided, since it is necessary in order that the first step (e.g. about −2 dB) does not differ too much between the smallest and largest possible loads. It is preferable that the minimum value of Rs should not be chosen to be too small, since this may result in very heavy load for a large attenuation. It is also preferable that the value of Rs should not be chosen to be too large, since the default output (reference output, zero dB), may mean the signal would be excessively attenuated. From experimentation, it was determined that a starting point of Rx=8Ω provides a good compromise between providing a minimum load and maximum attenuation for headsets.

In an embodiment, the values Rs and Rp may be determined using the above Equation 1 and Equation 2 by selecting a value for α, instead of a desired attenuation. For example, if α is chosen to be 0.625 and Rx is 8Ω, then the Rs value would be 12.8Ω and Rp would be 21.3Ω, and the corresponding attenuation would be the negative value of −20*log(α) which is −4.08 dB.

In yet another embodiment, the load impedance sensitivity may be removed where the relationship between values Rs and Rp is governed by the following function:

$$Rp=Rs*\alpha/(1-\alpha) \qquad \text{Equation 3}$$

where α is the desired attenuation value. Rs is selected as a compromise between a small finite value to give small difference between minimum and maximum connected load and a large value to limit power consumption. As can be seen with Equation 3, for α=1 (representation an implementation with no attenuation), the Rp value will be infinite, representing an arbitrarily large value, i.e. an open circuit.

The resistive divider networks of interface circuits 306 shown in circuits 500 and 500(2) may be implemented using programmable resistors (e.g. using a polysilicon layer or other resistor implemented on a silicon chip). The resistive control may be changed at low volume output levels (e.g. less than approximately 5 mW in output wattage) and then changed again at higher volume levels. For example, a change to the values may be implemented by first activating an input attenuator (e.g. divider 506, FIG. 5B, or another resistive element located before amplifier 304) when the noise floor is not within a certain value. This may be when the output is at a relatively high level. When the output of the amplifier is nearing a deemed noise floor and crosses a threshold, then an embodiment may utilize the interface circuit 306 components to provide an output attenuator for low-level amplification control. This may be done while keeping any current settings for divider 506. Prior to activation, the output attenuator may be set to a resistance value that is at or near 0 ohms. In other embodiments, the input and output attenuators may be controlled together when operating above or below a given threshold. Multiple thresholds can be provided where multiple adjustments to the controlled elements are provided. When controlling an output signal both the input and output attenuators may work together. When controlling a low level signal, the values for Rs and Rp for the output attenuator may be dynamically controlled with the values for the input attenuator to provide equal-step attenuation of the signals. With such an implementation, low power consumption may be achieved.

The output load resistors or load transistor may use a component having a low wattage rating (and physical size) to the small dissipated power. Even though precise step-wise volume adjustments are provided with above-described embodiments, there may be some difference in transfer function for the absolute attenuation, which may be acceptable in practice.

As noted, each of divider 506 and interface circuit 306 may attenuate the output signal of op amp 304. An embodiment allows divider 506 and circuit 306 to collectively attenuate signals. To provide same, each component is used at different stages of attenuation of the output signal.

To use both components, first, a range of attenuation for output signals for op amp 304 is determined. For the sake of illustration, a range of approximately 0 to 30 dB is used to describe features of this embodiment. For a first range of attenuation, divider 506 is used. Since divider 506 is located before op amp 304 values for components of the divider circuit would be smaller for a comparable divider circuit located at the output of op amp 304. An exemplary first range is approximately 0 to 20 dB of attenuation is provided by divider 506. When attenuation is being initiated, divider 306 is programmed with its correct values to cover the first range of attenuation. For a second range of attenuation, as the noise floor of op amp 304 approaches the signal level being processed by op amp 304, interface circuit 306 is used to implement further attenuations of signal and noise. The values for Rs and Rp in circuit 306 are determined based on a step-wise output value selected for circuit 300 (FIG. 3), as noted above. At this point, depending on the step-wise value selected, values for Rs and Rp may be programmed into their components. As the attenuation scale for the second range is reached, a third attenuation range may be provided. For the third range, divider 506 may be set to provide even more attenuation than the first range and then circuit 306 may be re-calibrated with new values for Rs and Rp to further process attenuating signals. More or less stages can be provided in other embodiments. Also, for a given stage, both divider 506 and circuit 306 may dynamically change their configurations to collectively provide a net attenuated signal using both stages for op amp 304. In yet another configuration digital attenuation is used when the analog attenuation has resulted in a sufficiently low noise floor, e.g. equivalent to the ambient acoustic noise when taking the transducer sensitivity into account.

It will be appreciated that for some mathematical values calculated for Rs and Rp, actual resistive values available (whether as discrete components or resistive values provided in a programmable resistor) for production modules, may not be identical to the calculated values. As such, when implementing a circuit for an embodiment, there may be differences between the desired and real values for the resistors selected for the programmable resistor. In the design stage, efforts can be made to track the available values to the calculated values, which may result in providing an implementation that may accurately track the calculated values. With the circuit, an embodiment provides a constant dynamic range over a wide range of output signals. This is due to the fact that both the output signal and the noise are attenuated (thus keeping the signal-to-noise ratio constant). This has an advantage over other systems that attenuate the output signal through other means (e.g. digitally at the microprocessor alone), since in those systems, the attenuation will only attenuate the signal, but will not attenuate the noise level, which results in a decrease of the signal-to-noise ratio with larger attenuation. For an embodiment, the effects of thermal noise in the resistors are deemed to be negligent. Other embodiments may take into consideration adjustments for such noise or other sources of noise (e.g. through filtering circuits and capacitors).

It will be appreciated that other filter circuits and other values for resistors shown in FIGS. 5A and 5B may be provided in other embodiments. It will also be appreciated that other isolation/attenuation systems may be provided for other input/output stages for a device.

Figure 5C:
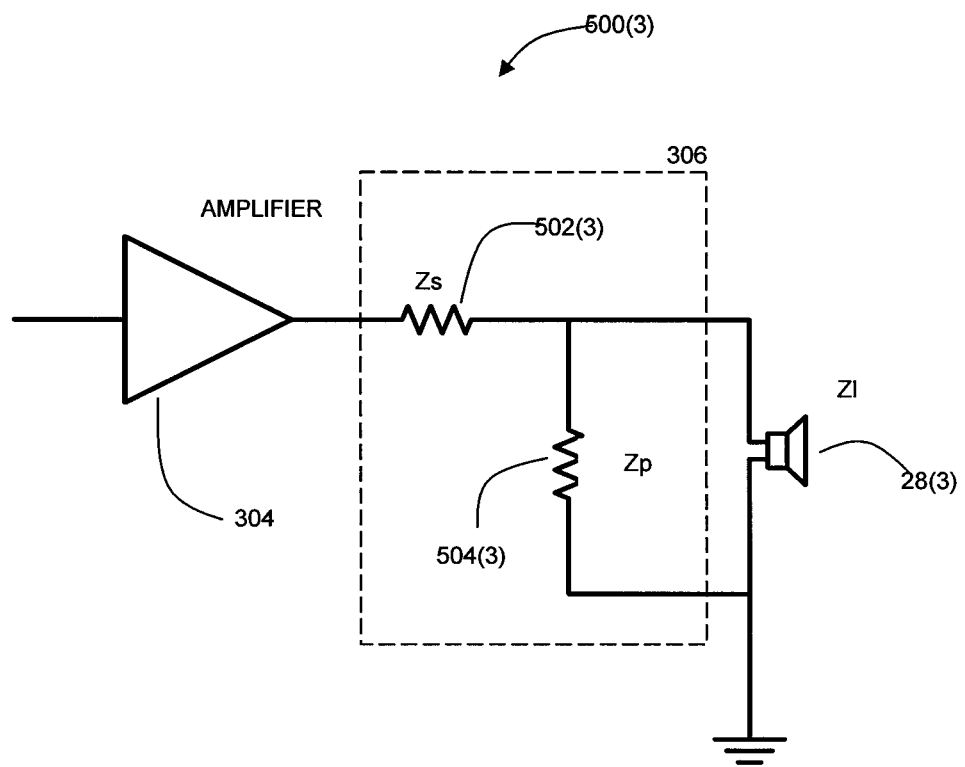
FIG. 5C is a schematic diagram of a third embodiment of the output circuit of FIG. 3.

Referring to FIG. 5C, in another embodiment, a divider arrangement using two complex impedances is provided. The output of amplifier 302 is provided to interface circuit 306 comprising impedance 502(3) and 504(2). Amplifier 304 is coupled to impedance 502(3) in series. Impedance 502(3) is coupled to impedance 504(3), which is coupled to ground. Impedances 502(3) and 504(3) are noted as impedances Zs and Zp, respectively. Terminal 32 (FIG. 2) is connected in parallel to impedance 504(3). When an impedance load (e.g.

headset 28) is attached to terminal 32, the circuit is complete and headset 28 is coupled in parallel with impedance 504(3). In other embodiments, one or more impedances may be provided where impedance 502(3) is located and one or more impedances may be provided where impedance 504(3) is located. Also, impedance load 28(3) may be connected with additional passive and/or reactive elements when bridging impedance 504(3). Additional passive and/or reactive elements may be provided along any path in circuit 500(3).

In an embodiment, circuit 500(3) provides a constant and finite output impedance as a reference. The finite impedance provides constant gain steps for different attached loads, where impedances are determined from the following functions:

$$Zs = Zx/\alpha \qquad \text{Equation 4}$$

$$Zp = Zx/(1-\alpha) \qquad \text{Equation 5}$$

where Zx is a reference impedance.

Now further details are provided on processes for identifying and selecting parameters for circuits of an embodiment.

Figure 6:
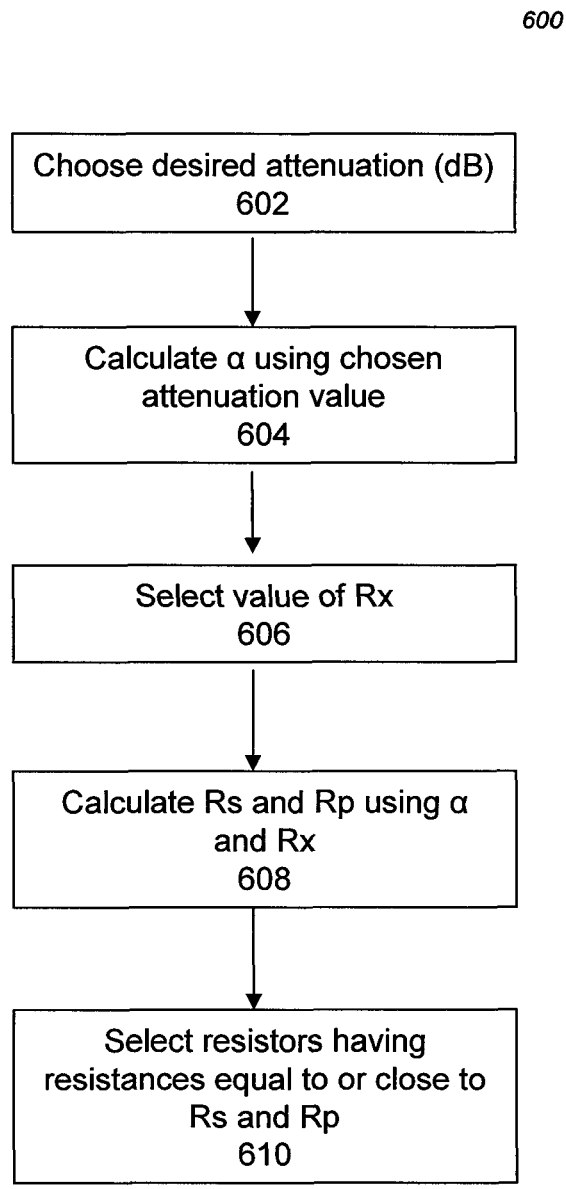
FIG. 6 is a flow chart of an exemplary process used to select components to comply with parameters of the output circuit of the device of FIG. 3.

FIG. 6 illustrates an exemplary process 600 for selecting the resistors in a resistive divider network for maintaining a constant dynamic range of an output signal from an amplifier in accordance with an embodiment of the application, which summarizes features previously discussed. At block 602, a desired attenuation in dB is chosen. At block 604, the value of α is calculated using the chosen attenuation value in accordance with the above formulae. At block 606, the value of Rx is selected. At block 608, the resistance values Rs and Rp are calculated in accordance with Equation 1 and Equation 2. At block 610, a first resistor with a resistance of Rs and a second resistor with a resistance of Rp are selected. In practice, resistance values may follow distinct steps so resistors having resistances approximate to the Rs and Rp may be used for implementing an embodiment of the application.

Alternatively, the resistors in the resistive divider network may be selected by first choosing a value for α and, in such a case, only processes in blocks 606, 608 and 610 may be executed.

Figure 7:
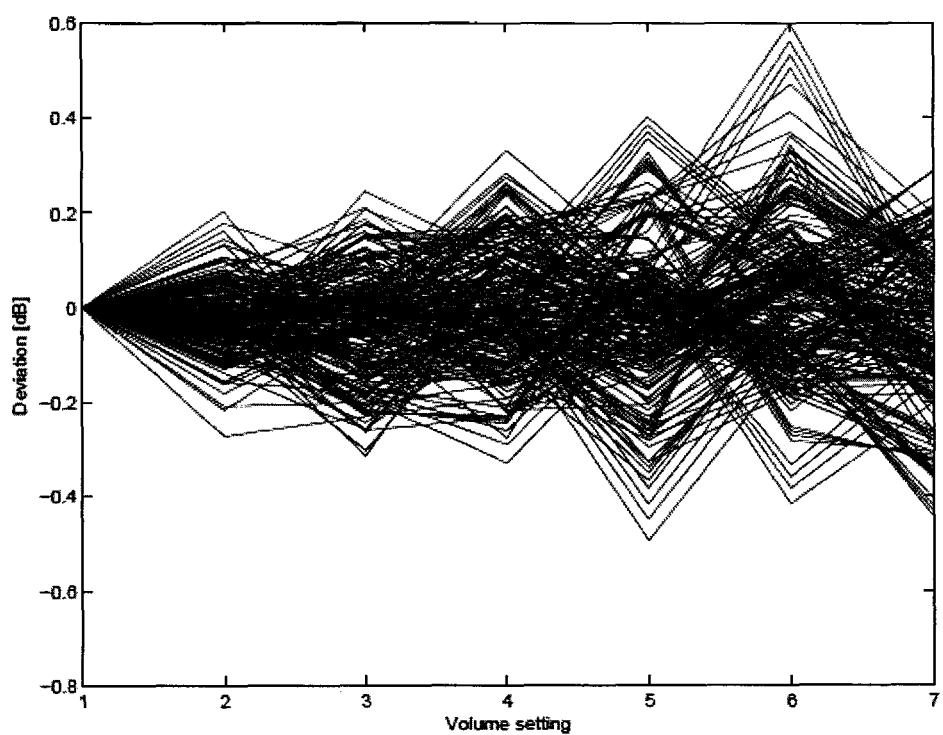
FIG. 7 is a chart of exemplary output signals from the output circuit of FIG. 3.

FIG. 7 shows experimental data of deviations from ideal response based on fifty (50) simulations and an individual variation of 2% (standard deviation). The deviations may in this case be up to approximately 0.6 dB, which may be acceptable since the attenuator is intended to be used for audio purposes. The load values were 16 Ω, 32 Ω, 72Ω and 10Ω. It can be seen, that the majority of the variation is within ±0.2 dB, although some shown values reach +0.6 dB. Note that the volume setting "1" corresponds to a reference attenuation and therefore there is no deviation for any of the resistor values.

It will be appreciated that the above described principles may be used for maintaining a constant dynamic range over a large attenuation range of an input signal from external devices connected to device 10, which may be achieved by reversing the resistance values Rs and Rp of the resistor components of the resistive divider network.

As used herein, the wording "and/or" is intended to represent an inclusive-or. That is, "X and/or Y" is intended to mean X or Y or both.

Exemplary advantages or benefits that may be realized from aspects of this disclosure include improved audio quality and flexibility of control with circuits by having first and second stages as described, with each stage being independently designed, while still acknowledging one stage's effect on the other stage. Flexibility is further provided by digital control allowing real time adjustments to be made to operating parameters of both the first and second stages.

In this disclosure, where a threshold or measured value is provided as an approximate value (for example, when the threshold is qualified with the word "about"), a range of values will be understood to be valid for that value. For example, for a threshold stated as an approximate value, a range of about 25% larger and 25% smaller than the stated value may be used. Thresholds, values, measurements and dimensions of features are illustrative of embodiments and are not limiting unless noted. Further, as an example, a "sufficient" match with a given threshold may be a value that is within the provided threshold, having regard to the approximate value applicable to the threshold and the understood range of values (over and under) that may be applied for that threshold.

It will be appreciated that the embodiments relating to circuits, algorithms, devices and systems may be implemented in a combination of electronic circuits, hardware, firmware and software. The circuits may be implemented in whole or in part through a combination of analog and/or digital components. In a circuit, an element may be connected to another element either directly or through another circuit. When a first element is identified as being connected to another element, that first element itself may be considered to be a "circuit". All components having stated resistances/inductances may be implemented in discrete (analog) components, in programmable components or a combination of both. The firmware and software may be implemented as a series of processes, applications and/or modules that provide the functionalities described herein. The algorithms and processes described herein may be executed in different order(s). Interrupt routines may be used. Data may be stored in volatile and non-volatile devices described herein and may be updated by the hardware, firmware and/or software.

It will further be appreciated that all processes, algorithms, steps etc. as described herein may be conducted in a single entity. For example the calculations for the first and/or second stages may be provided in the device itself. Such calculations may be conducted by one or more modules in the device. The disclosure as such provides a method of operating a device and/or a method for a function operating on the device. Alternatively, such calculations may be conducted in an off-site location (e.g. a design laboratory) and the resulting circuits and calculations can be provided to the device. The disclosure as such also provides a method of manufacturing, making and/or assembling the device.

The present disclosure is defined by the claims appended hereto, with the foregoing description being merely illustrative of embodiments of the disclosure. Those of ordinary skill may envisage certain modifications to the foregoing embodiments which, although not explicitly discussed herein, do not depart from the scope of the disclosure, as defined by the appended claims.

The invention claimed is:

1. An electronic circuit for an output signal of an amplifier in an electronic device, comprising:
   a speaker;
   a digital to analog converter (DAC);
   a microprocessor;
   a memory device storing instructions operable on the microprocessor to
   sum a first output signal from a source input signal with a volume signal for a volume control signal for the source input signal to produce a resultant signal;
   boost the resultant signal to a boosted signal to use available headroom in the DAC, the boosted signal being within a threshold of a maximum digital input level for the DAC; and
   provide the boosted signal to the DAC;

an amplifier connected to an output of the DAC; and
an interface circuit connected to an output of the amplifier and connected to the speaker, the interface circuit attenuating the output of the DAC to a second output signal representing a resultant volume level for the volume control signal, the interface circuit comprising
a first resistor coupled to the output of the amplifier in series, the first resistor having a resistance value Rs that limits current provided to the speaker from the electronic circuit;
a second resistor coupled to the first resistor in series, the second resistor having a resistance value Rp to reduce a load impedance sensitivity for the speaker, where the Rs and Rp values are related by an inversely proportional relationship; and
an output terminal for the speaker connected to the electronic device, the output terminal connected in parallel to the second resistor and providing the second output signal,
wherein
the second output signal has a noise floor that varies with an output level of the amplifier.

2. The electronic circuit of claim 1, wherein:

$Rp=Rs*\alpha/(1-\alpha)$, where $\alpha$ is a non-zero constant.

3. The electronic circuit of claim 2, wherein a value for a relates to a preset attenuation value for the electronic circuit.

4. The electronic circuit of claim 1, wherein:

$Rp=Rs*\alpha/(1-\alpha)$, where $\alpha$ is a non-zero variable.

5. The electronic circuit of claim 1, wherein
the attenuation=$-20 \log(\alpha)$, where $\alpha$ is a non-zero value.

6. The electronic circuit of claim 1, wherein:
Rs is set between approximately 10Ω and 32Ω; and
Rp is set between approximately 39Ω and 10Ω.

7. The electronic circuit of claim 1, wherein:

$Rs=Rx/\alpha$; and $Rp=Rx/(1-\alpha)$, where Rx is a reference series resistance used for the electronic circuit with no attenuation and $\alpha$ is an attenuation value.

8. The electronic circuit of claim 1, wherein:
the speaker is in a headset; and
the electronic circuit is provided in a communication device.

9. An electronic device, comprising:
a microprocessor;
a speaker;
a digital to analog converter (DAC);
an amplifier connected to an output of the DAC;
a memory device storing instructions operable on the microprocessor to
sum a first output signal from a source input signal with a volume signal for a volume control signal for the source input signal to produce a resultant signal;
boost the resultant signal to a boosted signal to use available headroom in the DAC, the boosted signal being within a threshold of a maximum digital input level for the DAC;
provide the boosted signal to the DAC; and
program resistance values for a first programmable resistor and a second programmable resistor;
an interface circuit connected to an output of the amplifier and connected to the speaker, the interface circuit attenuating an output of the DAC to a second output signal representing a resultant volume level for the volume control signal, the interface circuit comprising
the first programmable resistor coupled to the output of the amplifier in series, the first programmable resistor having a resistance value Rs that limits current provided to the speaker; and
the second programmable resistor coupled to the first resistor in series, the second programmable resistor having a resistance value Rp to reduce a load impedance sensitivity for the speaker; and
a terminal for the speaker, the terminal connected in parallel with a circuit containing the second programmable resistor,
wherein
the values Rs and Rp are related by an inversely proportional relationship; and
the second output signal at the terminal has a noise floor that varies with an output level of the amplifier.

10. The electronic device of claim 9, further comprising:
a programmable voltage divider circuit connected in series to an input terminal of the amplifier.

11. The electronic device as claimed in claim 9, wherein:
the output signal of the electronic circuit has a noise floor with at least approximately a 30 dB gain range.

12. The electronic device as claimed in claim 9, further comprising:
a digital to analog converter (DAC) connected to the electronic circuit to boosting a digital value for the output signal to a boosted value to utilize available signal headroom in the signal.

13. A method for controlling an output signal of an electronic circuit in an electronic device, comprising:
summing a first output signal from a source input signal with a volume signal for a volume control signal for the source input signal to produce a resultant signal;
boosting the resultant signal to a boosted signal to use available headroom in a digital to analog converter (DAC), the boosted signal being within a threshold of a maximum digital input level for the DAC;
providing the boosted signal to the DAC;
providing an output of the DAC to an amplifier; and
attenuating the boosted output signal through an interface circuit connected to the output of the amplifier and connected to a speaker, the interface circuit attenuating the output of the DAC to a second output signal representing a resultant volume level for the volume control signal, the interface circuit comprising
a first resistor coupled to the output of the amplifier in series, the first resistor having a resistance value Rs that limits current provided to the speaker from the electronic circuit;
a second resistor coupled to the first resistor in series, the second resistor having a resistance value Rp to reduce a load impedance sensitivity for the speaker, where the Rs and Rp values are related by an inversely proportional relationship; and
an output terminal for the speaker connected to the electronic device, the output terminal connected in parallel to the second resistor and providing the second output signal,
wherein
the second output signal of the electronic circuit has a noise floor that varies with an output level of the amplifier.

14. The method for controlling an output signal of an electronic circuit as claimed in claim 13, further comprising:

utilizing a voltage divider circuit connected in series to an input terminal of the amplifier to provide an input attenuation stage for the electronic circuit;

providing a first value to the voltage divider when the electronic circuit is producing an output above a first threshold; and providing a value for the second resistor when the electronic circuit is producing an output below the first threshold.

15. The method for controlling an output signal of an electronic circuit as claimed in claim 13, wherein:

an output signal at the output terminal has a dynamic range of at least approximately 90 dB.

16. A portable audio system for an electronic device, the portable audio system comprising:

a speaker;

a digital to analog converter (DAC);

a microprocessor;

a memory device storing instructions operable on the microprocessor to sum a first output signal from a first source input signal with a first volume signal for a first volume control signal for the first source input signal to produce a first summed signal;

sum a second output signal from a second source input signal with a second volume signal for a second volume control signal for the second source input signal to produce a second summed signal;

sum the first summed signal with the second summed signal to produce a resultant signal;

boost the resultant signal to a boosted signal to use available headroom in the DAC, the boosted signal being within a threshold of a maximum digital input level for the DAC; and provide the boosted signal to the DAC;

an amplifier connected to an output of the DAC; and an interface circuit connected to an output of the amplifier and connected to the speaker, the interface circuit attenuating the output of the DAC to a third output signal, the interface circuit comprising a first resistor coupled to an output of the amplifier in series, the first resistor having a resistance value Rs that limits current provided to the speaker; and a second resistor coupled to the first resistor in series, the second resistor having a resistance value Rp to reduce a load impedance sensitivity for the speaker, where the Rs and Rp values are related by an inversely proportional relationship; and an output terminal for the speaker connected to the electronic device, the output terminal connected in parallel to the second resistor and providing the third output signal, wherein the third output signal has a noise floor that varies with an output level of the amplifier.

17. The portable audio system as claimed in claim 16, wherein:

the first source input signal is a music file;

the first volume signal is for a volume control for a headphone amplifier for the electronic device; and the second source input signal relates to a telephone call being processed by the electronic device.

\* \* \* \* \*